United States Patent
Daidai et al.

(10) Patent No.: US 6,621,011 B1
(45) Date of Patent: Sep. 16, 2003

(54) ELECTRONIC CHIP COMPONENT

(75) Inventors: Muneyuki Daidai, Toyama (JP); Akihiro Nomura, Toyama-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/483,313

(22) Filed: Jan. 14, 2000

(30) Foreign Application Priority Data

Feb. 25, 1999 (JP) .......................................... 11-047604

(51) Int. Cl.⁷ ................................................. H05K 1/00
(52) U.S. Cl. ......................................... 174/258; 29/842
(58) Field of Search ............................. 174/51, 52, 54, 174/258, 256, 250; 248/209, 208, 201, 414, 416; 361/748, 750, 757–762; 29/830, 842

(56) References Cited

U.S. PATENT DOCUMENTS

| | | | |
|---|---|---|---|
| 4,849,486 A | * 7/1989 | Tsuchiya et al. | ............. 525/152 |
| 5,391,687 A | * 2/1995 | Shibata et al. | ................. 528/88 |
| 5,635,669 A | * 6/1997 | Kubota et al. | ............. 174/52.1 |
| 5,709,948 A | * 1/1998 | Hodgkin et al. | ............. 428/413 |
| 5,839,023 A | * 11/1998 | Morigami | ..................... 399/69 |
| 6,010,768 A | * 1/2000 | Yasue et al. | ................. 428/209 |
| 6,121,553 A | * 9/2000 | Shinada et al. | ............. 174/259 |
| 6,184,577 B1 | * 2/2001 | Takemura et al. | .......... 257/701 |
| 6,205,015 B1 | * 3/2001 | Wada et al. | .............. 361/321.4 |
| 6,232,144 B1 | * 5/2001 | McLoughlin | ............... 438/104 |
| 6,251,212 B1 | * 6/2001 | Moh et al. | ................ 156/308.2 |

FOREIGN PATENT DOCUMENTS

| | | |
|---|---|---|
| JP | 63-226016 | 9/1988 |
| JP | 3-44334 | 4/1991 |
| JP | 8-139562 | 5/1996 |

* cited by examiner

*Primary Examiner*—Kamand Cuneo
*Assistant Examiner*—Jeremy Norris
(74) *Attorney, Agent, or Firm*—Keating & Bennett, LLP

(57) ABSTRACT

An electronic chip component includes a package provided with external electrodes having excellent heat resistance and adhesion. In the electronic chip component, a package includes heat-resistant resin molding, and the external electrodes are provided on the surface of the package. The resin molding include a polymeric material having polar groups of at least one of an ether group, an ester group, a hydroxyl group, a carbonyl group, an amido group, and an imido group. The external electrodes have a multilayer structure having at least two layers including a lowermost layer containing a conductive film formed by baking conductive paste composed of a resin composition and metal particles at a low temperature, the resin composition including a compound having a trifunctional or higher functional group in one molecule. Each of the external electrodes includes an uppermost layer including a metal plate having good solderability.

19 Claims, 1 Drawing Sheet

ELECTRONIC CHIP COMPONENT

BACKGROUND OF THE INVENTION

1. Field of the Invention

Figure 1:
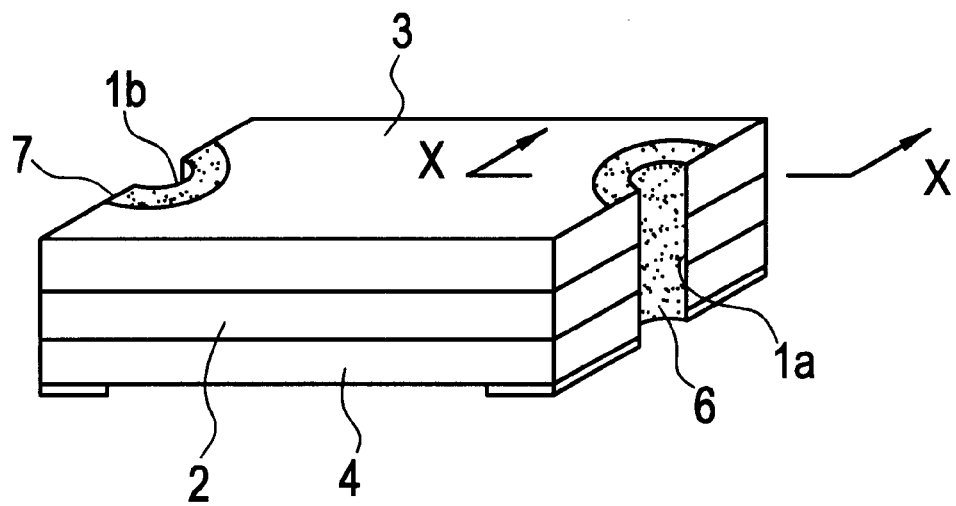

The present invention relates to an electronic chip component having a package in which at least a portion thereof is made of a resin molding and external electrodes are provided on the surface of the package.

2. Description of the Related Art

In order to increase the packaging density of a substrate in an electronic apparatus required by advances in miniaturization of electronic devices in general, electronic chip components that are mounted on the surface of a circuit board are widely used as electronic components. This type of electronic chip component mainly uses a ceramic package in order to ensure heat resistance to reflow soldering. External electrodes that are provided on the surface of the package are formed by baking thick-film silver to define a base, at sufficiently high temperatures (about 800° C.), and then plating the silver thereon.

However, such a ceramic package has drawbacks of having high material cost, difficulties in molding a complicated shape, the need for polishing such as lapping or the like to achieve thinning, high production cost, and other drawbacks. Thick-film silver which is baked at high temperature has the drawback of requiring a dedicated burning furnace, and so there is reduction in production efficiency. Therefore, this type of thick-film film silver cannot be applied to electronic components that have a portion that is weak against high-temperature thermal stress.

In order to solve the above problems, an external electrode is provided with a base electrode made of conductive paste of the type which is baked at low temperature, and a metal plate electrode provided on the surface of the base electrode (Japanese Unexamined Patent Publication No. 3-175711). In this case, the base electrode is baked at low temperatures (for example, about 200° C. or less) with low thermal stress when forming the external electrode, thereby having the advantage of permitting a wide range of applications.

However, in the use of conductive paste of the type which is baked at low temperature for forming the base electrode, in many cases, the base electrode cannot resist thermal stress caused during reflow soldering. This is because heat up to a temperature of about 250° C. is applied in reflow soldering, and thus, the base electrode is thermally deformed by this heat which causes cracks or separation in the base electrode.

SUMMARY OF THE INVENTION

To overcome the problems described above, preferred embodiments of the present invention provide an electronic chip component including a package, at least a portion of the package being made of a heat-resistant resin molding, and an external electrode provided on a surface of the resin molding, wherein the resin molding includes a polymeric material having polar groups of at least one of an ether group, an ester group, a hydroxyl group, a carbonyl group, an amido group, and an imido group, and the external electrode has a multilayered structure including at least two layers including a lowermost layer having a conductive film made of baked conductive paste including a resin composition and metal particles, and an uppermost layer including a metal plate having good solderability, the resin composition including a compound having a trifunctional or higher functional epoxy group in at least one molecule.

In another preferred embodiment of the present invention, an electronic chip component includes a package, at least a portion of the package is made of a heat-resistant resin molding, and an external electrode provided on a surface of the resin molding, wherein the resin molding includes a polymeric material having polar groups, and the external electrode has a multilayered structure having at least two layers which include a lowermost layer having a conductive film containing a resin composition and metal particles, the resin molding containing a compound having a trifunctional or higher functional epoxy group in at least one molecule.

In another preferred embodiment of the present invention, a method of manufacturing an electronic chip component includes the steps of providing a package having at least a portion of which is made of a heat-resistant resin molding such as a polymeric material having polar groups of at least one of an ether group, an ester group, a hydroxyl group, a carbonyl group, an amido group, and an imido group, and forming an external electrode having at least two layers, wherein a lowermost layer of the external electrode is formed on a surface of the resin molding by baking a conductive paste made of a resin composition and metal particles, wherein the resin composition includes a compound having a trifunctional or higher functional epoxy group in at least one molecule.

In preferred embodiments of the present invention, the resin molding provides greater heat resistance while the polymeric materials having the polar groups provide greater adhesion with the lowermost layer of the external electrode because the conductive paste is made of a resin composition and metal particles, especially when the resin composition is made of a trifunctional or higher functional epoxy group.

Other features, elements and advantages of the present invention will be described in detail below with reference to preferred embodiments of the present invention and the attached drawings.

BRIEF DESCRIPTION OF THE ATTACHED DRAWINGS

Figure 2:
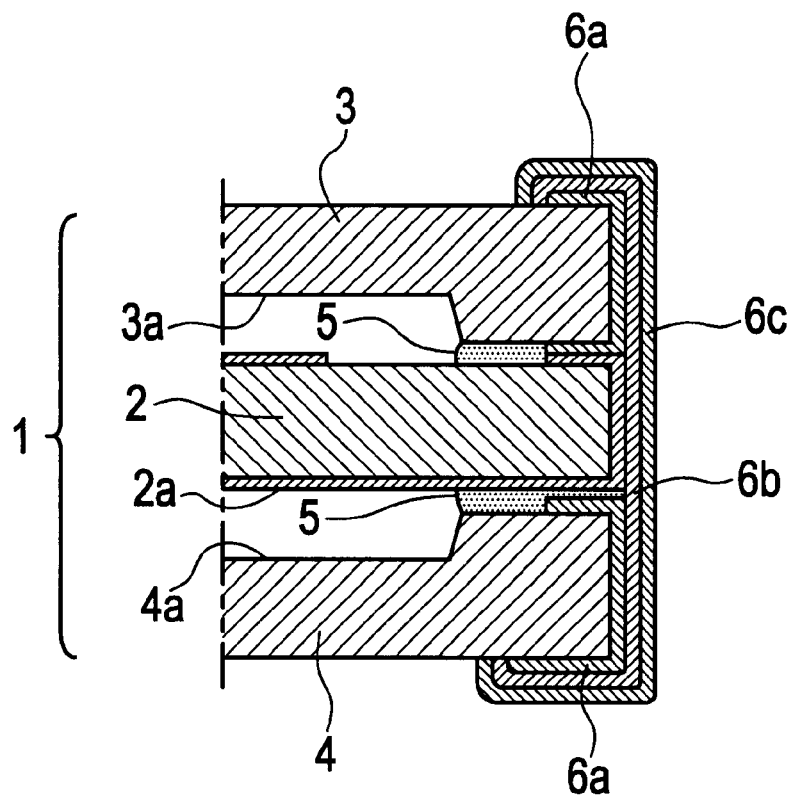

The present invention will become more fully understood from the detailed description given herein below and the accompanying drawings which are given by way of illustration only, and thus do not limit the present invention and wherein:

FIG. 1 is a perspective view of the electronic chip component according to a preferred embodiment of the present invention; and FIG. 2 is a sectional view taken along line X—X in FIG. 1.

DETAILED DESCRIPTION OF PREFERRED EMBODIMENTS

FIGS. 1 and 2 show an electronic chip component according to a preferred embodiment of the present invention. Although, in the present preferred embodiment, a surface mounting type piezoelectric oscillator is shown, a chip resistor, a chip capacitor, a chip semiconductor, or any other electronic component may be provided incorporating the novel features of the present invention.

An electronic chip component 1 preferably has a layered structure having a ceramic piezoelectric resonator element 2, which is polarized, and sealing substrates 3 and 4 bonded to the upper and lower sides of the resonator element 2. Each of the sealing substrates 3 and 4 preferably has a heat-resistant resin molding having polar groups. In the present preferred embodiment, each of the sealing substrates 3 and 4 is preferably made by molding an epoxy resin into a plate by injection molding, and then roughening the surface thereof via sand blasting or other roughening process.

The surface of the resin molding is made rougher between the interface of the resin molding and the external electrodes, which are provided later, to further improve the adhesion of the external electrodes due to an anchoring effect. To make the surface rougher, a chemical or physical method may be used. For example, either sand blasting or barrel polishing can be used.

For the material for the resin molding, it is preferable to use a polymeric material having heat resistance to reflow temperature or greater (i.e., a heat deflection temperature of about 220° C. or more, and a melting point of about 260° C. or more), and polar groups of at least one of an ether group, an ester group, a hydroxyl group, a carbonyl group, an amido group, and an imido group. Examples of such materials include epoxy resins, LCO (liquid crystal plastics), PEEK (polyether ether ketone), PEI (polyether imide), PPA (polyphthalamide), and other similar materials. For the molding method, known molding methods such as injection molding, compression molding, transfer molding, and other similar methods may be used.

The sealing substrates 3 and 4 preferably have recessed portions 3a and 4a, respectively. The recessed portions 3a and 4a are provided at the inner surfaces thereof in order to provide vibration spaces between the sealing substrates 3 and 4 and the piezoelectric resonator element 2. The peripheral portions of the sealing substrates 3 and 4, which respectively surround the recessed portions 3a and 4a, are bonded to each other with the piezoelectric resonator element 2 and an adhesive 5 provided therebetween. Through-hole portions 1a and 1b are provided at the end surfaces of the electronic chip component 1 and extend in the thickness direction. External electrodes 6 and 7 are provided on the inner surfaces of the through hole portions 1a and 1b, respectively.

Thin-film inner electrodes 2a are provided on the top and bottom surfaces of the piezoelectric resonator element 2, including the end surfaces thereof, via sputtering, vaporization, or other similar methods. A base layer 6a of the external electrode 6 is provided on one of the end surfaces of the sealing substrates 3 and 4. Although FIG. 2 shows only the external electrode 6, the other external electrode 7 preferably has substantially the same structure. The base layer 6a includes a conductive film formed by baking at a low temperature. The conductive paste contain the composition as shown in Table 1. The conductive paste has a binder (resin composition) containing a compound having a tri-functional or higher function epoxy group in a molecule molecules thereof, for defining the conductive paste (in the present preferred embodiment, TGDDM).

TABLE 1

| Composition of Conductive Paste | Example | Comparative Example |
|---|---|---|
| TGDDM (tetrafunctional epoxy resin) | 7 | — |
| DGEBA (difunctional epoxy resin) | 7 | 14 |
| Dicyandiamide (curing agent) | 2 | 2 |
| Silver particles (metal particles) | 74 | 74 |
| Nickel particles (metal particles) | 10 | 10 |

In Table 1, the numerals represent percentages by weight, TGDDM represents tetraglycidylaminodiphenylmethane, and DGEBA represents bisphenol A diglycidyl ether.

Note that for the conventional type of conductive paste which is baked at low temperature, a difunctional epoxy resin such as DGEBA (bisphenol A diglycidyl ether) is only used as the binder. Such a difunctional epoxy resin has good dispersibility of metal particles, and is easy to handle as conductive paste, but it cannot withstand thermal stress caused by reflow soldering.

On the other hand, the use of a trifunctional epoxy resin as a binder improves the heat resistance, but adhesion to the package on which the external electrodes are provided is not adequate. Therefore, in preferred embodiments of the present invention, a low-temperature baked conductive paste containing a trifunctional or higher functional epoxy resin is used for the base layer 6a of the external electrode 6, and the package includes a heat resistant resin molding made of a polymeric material having polar groups, thereby achieving an electronic chip component having heat resistance to reflow soldering, and excellent adhesion between the package and the external electrodes. This is due to the fact that the polymeric material having polar groups forms hydrogen bonds in bonding to the epoxy resin contained in the base layer 6a of the external electrode 6, thus achieving high adhesive force.

The binder of the conductive paste used for forming the base electrodes of the external electrodes preferably has a trifunctional or higher functional epoxy resin in order to impart heat resistance thereto. Examples of trifunctional or higher functional epoxy resins include TGDDM (tetraglycidylaminophenylmethane), TGXDA (tetraglycidylmethaxylenediamine), TGBACH (tetraglycidyl-1,3-bisaminomethylcyclohexane), EPN (phenol novolac epoxy resin), ECN (cresol novolac epoxy resin), and other similar materials.

In the present preferred embodiment of the present invention, a tetrafunctional epoxy resin and a difunctional epoxy resin are preferably both used as the binder because the use of only the tetrafunctional epoxy resin exhibits low dispersion of the metal particles. In order to improve coating workability, a difunctional epoxy resin such as an ethylene glycol ether solvent was added to the conductive paste.

For the metal particles that are included in the base layer 6a of the external electrode 6, metal particles having conductivity and good chemical stability, such as silver, are preferred. Copper, nickel, or other similar methods may be added to this metal. In order to improve the adhesion between the base layers and the metal plates of the external electrodes, the ratio of the metal particles shall preferably be between about 60% to about 90% by weight. This is required because if the ratio is less than about 60%, adhesion to the upper metal plates deteriorates, while if the ratio is over about 90%, adhesion to the resin molding deteriorates.

In an example of the present preferred embodiment, the conductive paste is preferably coated at the end surfaces and the upper and lower surfaces of the sealing substrates 3 and 4 by screen printing, as well as on the inner surfaces of the through hole portions 1a and 1b by suction printing or other similar methods. Then, the conductive paste is heat-treated at about 160° C. for 1 hour, and then cured.

In the example of the present preferred embodiment of the present invention, after the piezoelectric resonator element 2 and the sealing substrates 3 and 4 are laminated, an intermediate layer 6b is continuously formed on the base layer 6a and the inner electrodes 2a by nickel plating, and an uppermost layer 6c is continuously formed on the intermediate layer 6b by gold plating to complete the external electrode 6. More specifically, after the intermediate layer 6b of the electronic component 1 having the layered structure is formed by nickel electroplating, electroless gold plating is performed. The nickel plate thickness is preferably about 2 μm and the gold plate thickness is preferably about 0.1 μm. The nickel plate functions as a barrier layer for preventing solder leaching, the gold plate functions to prevent oxidation of the nickel on the base metal plate, and also to improve solderability.

Table 2 below shows the results of another example of the present preferred embodiment of the present invention under the following conditions:

(1) A resin substrate having a thickness of about 1 mm was prepared, and conductive paste was printed on the end surface of the substrate by screen printing, and then cured.

(2) A metal was plated on the cured conductive paste under the same conditions as the above example.

(3) After flux was coated on the surface, the resin substrate was immersed in a solder bath of about 260° C. for about 20 seconds to perform pre-soldering.

(4) The resin substrate was cross-cut into approximately 2-mm squares.

(5) A solder-plated soft copper wire of about 0.6 mm in diameter was soldered to the area of each 2-mm square by using an iron. The temperature of the iron end was about 310° C.

(6) The soft copper wire was pulled vertically, and the value of the force at the time of breakage was recorded. The rate of tension was 20 mm/min.

In Table 2, the units are in kgf.

TABLE 2

| Resin substrate | | | Binder component of conductive paste | |
|---|---|---|---|---|
| Polarity | Resin material | Surface roughness | TGDDM | DGEBA |
| Nonpolar | SPS | Present | 1.2 | Unmeasurable |
| | | Absent | 0.8 | Unmeasurable |
| | PPS | Present | 2.4 | 1.3 |
| | | Absent | 1.6 | 0.9 |
| Polar | Epoxy resin | Present | 4.5 | 2.5 |
| | | Absent | 4.3 | 2.2 |
| | LCP | Present | 4.2 | 1.9 |
| | | Absent | 3.2 | 1.8 |

As the comparative examples of the heat-resistant resin substrate, nonpolar SPS (syndiotactic polystyrene) and PPS (polyphenylene sulfide) were tested at the same time. As the comparative example of the conductive paste, paste containing only the difunctional epoxy resin shown in Table 1 was tested at the same time.

Table 2 indicates that combinations of a polar resin molding and conductive paste containing a tetrafunctional epoxy resin (TGDDM) exhibit peel strength as high as about 3.2 kgf or more, and note that the use of a resin molding having a rough surface exhibits peel strength of about 4 kgf or more. As a result of examination conducted by the inventors, it was determined that a peel strength of 2 kgf or more is adequate for practical use. Thus, with the present invention, an external electrode having excellent heat resistance and adhesion is obtained.

Note that the present invention is not limited to the above-described preferred embodiments. Although the inner element of an electronic component is not limited to the piezoelectric resonator elements, note especially that the piezoelectric resonator element has the probability of having changes occur in the polarization due to excessive heat. By using low-temperature baking type conductive paste as in the present invention, it is possible to maintain polarization characteristics, and thus obtain an electronic chip component having stable qualities.

Although the above preferred embodiment only discloses a layered structure where the heat-resistant resin moldings are bonded to the upper and lower sides of the piezoelectric resonator element, the entire package of the electronic chip component may have the heat-resistant resin molding, or only a portion of the package may have the heat-resistant resin molding for an electronic chip component in which a metal cap is attached to a heat-resistant resin substrate.

Also in the present preferred embodiment, the external electrode has a three layer structure including the base layer having conductive paste, and two metal plate layers. However, the external electrode is not limited to this structure, and may have one or at least three or more metal plate layers.

If unlike in the above preferred embodiment, the package is partially made of a material other than a heat-resistant resin molding such as a ceramic material (piezoelectric resonator element), a portion of the external electrodes may not contain the base layer that is made of conductive paste.

As seen from the above description, an electronic chip component of the present invention has the following features and advantages:

(1) A package includes a heat-resistant resin molding, thereby overcoming the problems of a ceramic package.

(2) A resin molding includes a polymeric material having polar groups, thereby improving adhesion to a base layer of an external electrode.

(3) Low-temperature baking type conductive paste is used for the base layer of the external electrode, thereby decreasing thermal stress in forming the base layer, and permitting application to a wide range of electronic components.

(4) A compound containing a trifunctional or higher functional epoxy group is included as a resin composition (binder) for the conductive paste, so as to ensure heat resistance from reflow soldering.

(5) A metal plate having good solderability is provided as the uppermost layer of the external electrode, thereby improving solderability.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic chip component comprising:

a package having at least a portion made of a heat-resistant resin molding; and an external electrode provided on a surface of the resin molding;

wherein the resin molding includes a polymeric material having polar groups of at least one of an ether group, an ester group, a hydroxyl group, a carbonyl group, an amido group, and an imido group, and the external electrode has a multilayered structure having at least two layers including a lowermost layer comprising a low-temperature-baked conductive paste including a resin composition and metal particles, and an uppermost layer including a metal plate having solderability, the resin composition including a compound having a trifunctional or higher functional epoxy group in at least one molecule thereof, the lowermost layer being disposed on the surface of the resin molding.

2. The electronic chip component according to claim 1, wherein the polar groups include at least one of epoxy resins, liquid crystal plastics, polyether ether ketone, polyether imide, and polyphthalamide.

3. The electronic chip component according to claim 1, wherein the resin composition further includes a compound having a difunctional epoxy resin.

4. The electronic chip component according to claim 1, wherein the resin composition further includes a curing agent.

5. The electronic chip component according to claim 1, wherein the resin composition having the trifunctional or higher functional epoxy group includes at least one of TGDDM, TGXDA, TGBACH, EPN, ECN.

6. The electronic chip component according to claim 1, wherein the metal particles include at least one of silver, copper, and nickel.

7. The electronic chip component according to claim 1, wherein a ratio of the metal particles of the conductive paste, which defines the lowermost layer of the external electrode, is between about 60% to about 90% by weight.

8. The electronic chip component according to claim 1, wherein the surface of the resin molding is roughened at an interface between the resin molding and the external electrode.

9. An electronic chip component comprising:
a package having at least a portion made of a heat-resistant resin molding; and
an external electrode provided on a surface of the resin molding;
wherein the resin molding includes a polymeric material having polar groups, and the external electrode has a multilayered structure having at least two layers including a lowermost layer disposed on the surface of the resin molding and comprising a conductive film having a resin composition and metal particles, the resin composition containing a compound having a trifunctional or higher functional epoxy group in at least one molecule, and an uppermost layer disposed on the lowermost layer.

10. The electronic chip component according to claim 9, wherein the polar groups include at least one of an ether group, an ester group, a hydroxyl group, a carbonyl group, an amido group, and an imido group.

11. The electronic chip component according to claim 9, wherein the uppermost layer includes a metal plate with solderability.

12. The electronic chip component according to claim 9, wherein a ratio of the metal particles of the conductive film, which defines the lowermost layer of the external electrode, is between about 60% to about 90% by weight.

13. The electronic chip component according to claim 9, wherein the surface of the resin molding is roughened at an interface between the resin molding and the external electrode.

14. The electronic chip component according to claim 9, wherein the resin composition having the trifunctional or higher functional expoxy group includes at least one of TGDDM, TGXDA, TGBACH, EPN, ECN.

15. The electronic chip component according to claim 9, wherein the polar groups include at least one of epoxy resins, liquid crystal plastics, polyether ether ketone, polyether imide, polyphthalamide.

16. A method of manufacturing an electronic chip component comprising the steps of:
providing a package having at least a portion made of a heat-resistant resin molding such as a polymeric material having polar groups of at least one of an ether group, an ester group, a hydroxyl group, a carbonyl group, an amido group, and an imido group; and
forming an external electrode comprising at least two layers including a lowermost layer and an uppermost layer, wherein the lowermost layer of the external electrode is provided on a surface of the resin molding by baking a conductive paste made of a resin composition and metal particles, wherein the resin composition includes a compound having a trifunctional or higher functional epoxy group in at least one molecule, and the uppermost layer is formed on the lowermost layer.

17. The method of claim 16, wherein baking the conductive paste includes mixing the resin composition and the metal particles such that the lowermost layer of the external electrode has a ratio between about 60% and about 90% of metal particles by weight.

18. The method of claim 16, wherein forming the external electrode includes providing an uppermost layer including a metal plate having good solderability.

19. The method of claim 16, further including the step of roughening the surface of the resin molding at an interface between the resin molding and the external electrode.

* * * * *